United States Patent [19]
Kim

[11] Patent Number: 5,966,321
[45] Date of Patent: Oct. 12, 1999

[54] SRAM CELL HAVING INCREASED CELL RATIO

[75] Inventor: Jae-Kap Kim, Ichon, Rep. of Korea

[73] Assignee: Hyundai Electronics Industries Co., Ltd., Kyoungki-do, Rep. of Korea

[21] Appl. No.: 08/825,298

[22] Filed: Mar. 27, 1997

[30] Foreign Application Priority Data

Mar. 28, 1996 [KR] Rep. of Korea .................. 96-8946

[51] Int. Cl.$^6$ ................................................ G11C 11/00
[52] U.S. Cl. ........................................ 365/156; 365/49
[58] Field of Search ............................... 365/156, 49

[56] References Cited

U.S. PATENT DOCUMENTS

| | | | |
|---|---|---|---|
| 4,499,652 | 2/1985 | Shrivastava | 29/571 |
| 5,047,818 | 9/1991 | Tsukamoto | 357/23.6 |
| 5,311,464 | 5/1994 | Takase et al. | 365/156 |
| 5,324,973 | 6/1994 | Sivan | 257/330 |
| 5,386,379 | 1/1995 | Ali-Yahia et al. | 365/49 |
| 5,396,098 | 3/1995 | Kim et al. | 257/344 |
| 5,396,449 | 3/1995 | Atallah et al. | 365/49 |
| 5,406,107 | 4/1995 | Yamaguchi | 257/393 |
| 5,515,313 | 5/1996 | Yamaguchi | 365/156 |

FOREIGN PATENT DOCUMENTS

| | | |
|---|---|---|
| 53-53281 | 5/1978 | Japan . |
| 57-60853 | 4/1982 | Japan . |
| 4192189 | 7/1992 | Japan . |
| 557855 | 7/1993 | Japan . |
| 5304274 | 11/1993 | Japan . |
| 7130880 | 5/1995 | Japan . |

OTHER PUBLICATIONS

7–130880 Patent Abstracts of Japan May 19, 1995.
5–304274 Patent Abstracts of Japan Nov. 16, 1993.
57–60853 English Translation of Purpose & Constitution of Japanese Laid–Open No. 57–60853 Published Apr. 13, 1982.
53–53281 English Translation of Purpose and Constitution of Japanese Laid–Open No. 53–53281 Published May 15, '78.
4–192189 English Translation of Purpose and Constitution of Japanese Laid–Open No. 2–320673 published Jul. 10, '92.
5–57855 English Translation of Object and Constitution of Japanese Laid–Open No. 5–57855 published Jul. 30, 1993.

*Primary Examiner*—David Nelms
*Assistant Examiner*—Hien Nguyen
*Attorney, Agent, or Firm*—Ware, Fressola, Van Der Sluys & Adolphson LLP

[57] ABSTRACT

An SRAM cell capable of enhancing the cell ratio and method of manufacturing the same are disclosed. The SRAM cell has pull-up devices, pull-down devices and access devices that interconnected at cell nodes, including : current reduction part for reducing current of the access devices, wherein the current reduction part is connected with the access devices and the cell nodes.

7 Claims, 4 Drawing Sheets

SRAM CELL HAVING INCREASED CELL RATIO

BACKGROUND OF THE INVENTION

1. Field of the Invention

The present invention relates to a semiconductor memory device and method of manufacturing the same, and more particularly, to a static random access memory cell capable of enhancing the cell ratio and method of manufacturing the same.

2. Description of the Related Art

A semiconductor memory device is classified into a dynamic random access memory (DRAM) and a static random access memory (SRAM) according to its memorizing method. SRAM is particularly significant due to its high speed, low power consumption, and simple operation. In addition, unlike the DRAM, the SRAM has advantages of straight forward design as well as not having to regularly refresh stored data.

In general, SRAM cell includes two driving transistors which are the pull-down devices; two access devices; and two pull-up devices. The SRAM cell is further classified as a full CMOS cell, a high road resistor (HRL), or thin film transistor (TFT) cell according to the type of the pull-up devices used.

The full CMOS cell utilizes a P-channel bulk MOSFET as the pull-up device. The HRL cell utilizes a polysilicon having a high resistance value as the pull-up device, and The TFT cell utilizes P-channel polysilicon TFT as the pull-up device. Of the above-mentioned structures, the SRAM cell with the full CMOS cell structure has optimal operational device properties and can be fabricated with a simple process. It, however, has both NMOS and PMOS transistors in the unit cell, resulting in a large cell size. Therefore, it is applied to memory devices having a small capacitance. On the other hand, SRAM cells with the HRL cell and the TFT cell structures have relatively poor performance and is complicated in their fabrication. Because of their small cell size, however they are generally applied to semiconductor memory devices in cases of larger capacitance.

FIG. 1 is a conventional circuit diagram of an SRAM cell with full CMOS cell structure.

As shown in this diagram, sources of PMOS transistors Q1 and Q2 for use in pull-up devices are connected to VDD. Drains of the PMOS transistors Q1 and Q2 are respectively connected in series to drains of NMOS transistors Q3 and Q4 for use in pull-down devices at cell nodes N1 and N2. Sources of the NMOS transistors Q3 and Q4 are connected to VSS. Gates of the PMOS transistors Q1 and Q2 are respectively connected to gates of the NMOS transistors Q3 and Q4, and these connection points thereof are respectively cross-coupled with the cell nodes N1, N2. In NMOS transistors Q5 and Q6 for use in access devices, gates are connected to a word line W/L, sources are respectively connected to bit lines B/L1 and B/L2. Drains of NMOS transistors Q5 and Q6 are respectively connected to the drains of the NMOS transistors Q3 and Q4 at the cell nodes N1, N2.

In the above described SRAM cell, the NMOS transistors Q5 and Q6 are turned on by turning on the word line W/L, to store data in a HIGH state in the node N1 and data in a LOW state in the node N2. Data in a HIGH state is inputted to the bit line B/L1 and data in a LOW state is inputted to the bit line B/L2, so that the PMOS transistor Q1 and NMOS transistor Q4 are turned on, and PMOS transistor Q2 and NMOS transistor Q3 are turned off. Therefore, the node N1 becomes a HIGH state and the cell node N2 becomes a LOW state. Furthermore, although the word line W/L is turned off, the cell node N2 is latched to maintain a LOW state and the cell node N1 is maintained at a HIGH state. Accordingly, data is stored in the cell nodes N1 and N2 respectively.

FIG. 2 is a plan view of the SRAM cell illustrated in FIG. 1. Referring to FIG. 2 with cross reference to FIG.1, A1 and A2 are the active regions of the PMOS transistors Q1 and Q2 for use in pull-up devices, B1 and B2 are the active regions of the NMOS transistors Q3 and Q4 for use in pull-down devices and the NMOS transistors Q5 and Q6 for use in access devices. C1 to C6 are the contact regions. Here, C1 and C2 denote contact regions of cell nodes N1 and N2. C3 and C4 denote contact regions of sources of the NMOS transistors Q5 and Q6. C5 denotes contact regions of sources of the PMOS transistors Q1 and Q2, and C6 denotes contact regions of sources of the NMOS transistors Q3 and Q4. There are also provided word lines 34a, 34b, and 54.

Meanwhile, FIG. 3 is a sectional view of the active region B1 taken along line III-III' of FIG. 2, and illustrates the sectional structure of the NMOS transistor Q3 for use in pull-down devices and the NMOS transistor Q5 for use in access devices.

As illustrated in FIG. 3, the NMOS transistor Q3 for use in pull-down devices and the NMOS transistor Q5 for use in access devices include : a semiconductor substrate 1 having an active region B1 of the NMOS transistor Q3 for use in pull-down devices and the NMOS transistor Q5 for use in access devices defined by a field oxide layer 2; a gate oxide layer 3 formed on the substrate 1 between the field oxide layer 2 and gates 34a and 54; source regions 5a, 5c and a common drain region 5b formed in the active region B1 both sides of the gates 34a and 54; an intermediate insulating layer 6 formed on the overall surface of the substrate and having contact holes which expose predetermined portions of the source regions 5a, 5c and the drain region 5b; metal-interconnection layers 7a, 7b and 7c connected with the source regions 5a, 5c and the drain region 5b through the contact holes.

Meanwhile, one of the factors determining the characteristics of the SRAM is the current driving capability ratio of the pull-down device, which is the quotient of the current amount of the driving device divided by the current amount of the access device($I_{DSAT\ DRIVER\ TRANSISTOR}/I_{DSAT\ ACCESS\ TRANSISTOR}$), otherwise known as cell ratio. A higher cell ratio results in improved performance of the SRAM. Therefore when the current amount of the pull-down device is large and the current amount access device is small, the performance of the SRAM cell is improved.

An operation of the SRAM related to the cell ratio is as follows. In case that the data in a low state is stored in the node N1 and the data in a high state is stored in the cell node N2, the voltage of the cell node N1 is determined by the current amount ratio of the NMOS transistors Q5 and Q6 for use in access devices and the NMOS transistors Q3 and Q4 for use in pull down devices. Accordingly, the node N1 is intended to maintain the low voltage with the increase of the current amount of the NMOS transistors Q3 and Q4, and with the decrease of the current amount of the NMOS transistors Q5 and Q6. If so, the voltage of the cell node N1 is not drastically changed from the low state when the NMOS transistors Q5 and Q6 are turned on during the reading operation, even though the voltage of the bit line B/L1 is changed. In case the voltage variation of the cell node N1 is small, the voltage of the cross-coupled cell node N2 is still maintained in the high state.

Therefore, conventionally, the cell ratio is controlled in a manner wherein the width of the NMOS transistor for use in access devices is reduced and its length is increased thereby increasing its current amount, and the width of the NMOS transistor for use in pull-down devices is increased and its length is reduced to thereby reduce its current amount. The width and length of the transistor, however, cannot be reduced below a predetermined level, and therefore there is a restriction in reducing the size of the cell to enhance the cell ratio.

SUMMARY OF THE INVENTION

Accordingly, an object of the present invention is to provide an SRAM cell and method of manufacturing the same, which inserts a resistance between a cell node and a access device thereby reducing the current amount of the access device and enhancing the cell ratio of the SRAM cell.

To achieve the above object, according to the first aspect of the present invention, there is provided an SRAM cell having pull-up devices, pull-down devices and access devices that are interconnected at cell nodes, including current reduction means for reducing current of the access devices, wherein the current reduction means are connected with the access devices and the cell nodes.

In this embodiment, the current reduction means imports a resistance.

Furthermore, according to the second aspect of the present invention, there is provided an SRAM cell comprising : a semiconductor substrate of a first conductivity type of which active region is defined; a gate insulating layer formed on the substrate; first and second gates formed on the gate insulating layer and a third gate formed between said first and second gates; a channel region of a second conductivity type formed in the active region under the third gate; impurity diffusion regions of the second conductivity type formed in the active region both sides of the first, second and third gates; an intermediate insulating layer formed on the substrate, and having contact holes to expose the impurity diffusion regions located at either side of the first gate and a side of the second gate that is not adjacent to the third gate; and metal-interconnection layers in contact with exposed impurity diffusion regions through the contact holes.

Furthermore, there is provided a method of manufacturing an SRAM cell having pull-up devices, pull-down devices and access devices, the manufacturing method comprising the steps of: providing a semiconductor substrate of a first conductivity type of which an active region of the pull-down device and the access device is defined; forming a channel region of a second conductivity type in a predetermined portion of the active region between the pull-down device and the access device; forming a gate insulating layer on the substrate; forming first and second gates on the pull-down device and the access device and a third gate on the channel region; and forming impurity diffusion regions of said second conductivity type in the active region on both sides of said first, second and third gates.

In this embodiment, the channel region is formed at the same time that ion implanting of impurity ions of the second conductivity type to control a threshold voltage of the pull-up devices occurs.

BRIEF DESCRIPTION OF THE ATTACHED DRAWINGS

The objects and features of the invention may be better understood with reference to the following detailed description, appended claims, and attached drawings wherein:

FIG. 1 is a circuit diagram of a conventional SRAM cell with a full CMOS cell structure;

FIG. 2 a plan view of a conventional SRAM cell with a full CMOS cell structure;

DETAILED DESCRIPTION OF PREFERRED EMBODIMENT

A preferred embodiment according to the present invention is described below with reference the attached drawings, FIG. 4 to FIG. 6.

Figure 1:
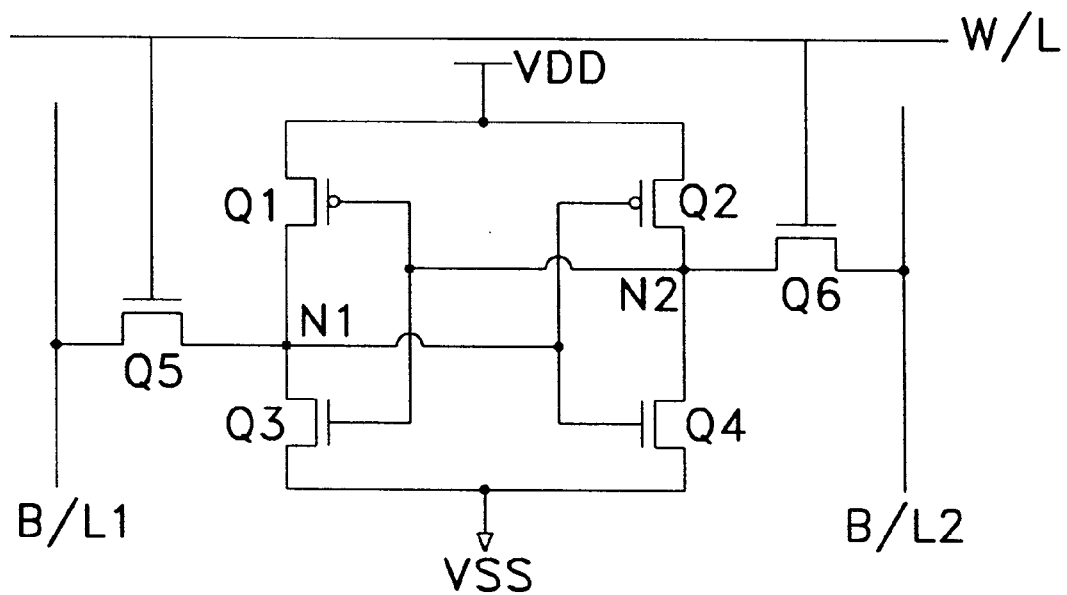
Figure 2:
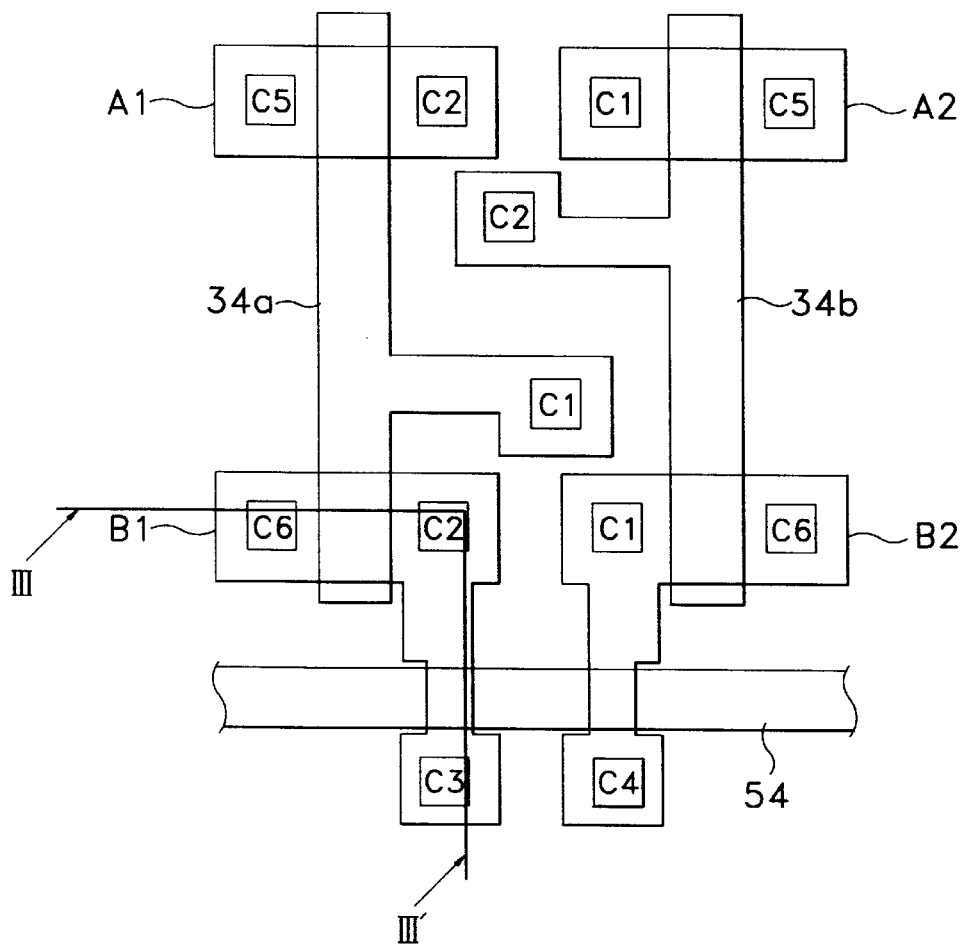
Figure 3:
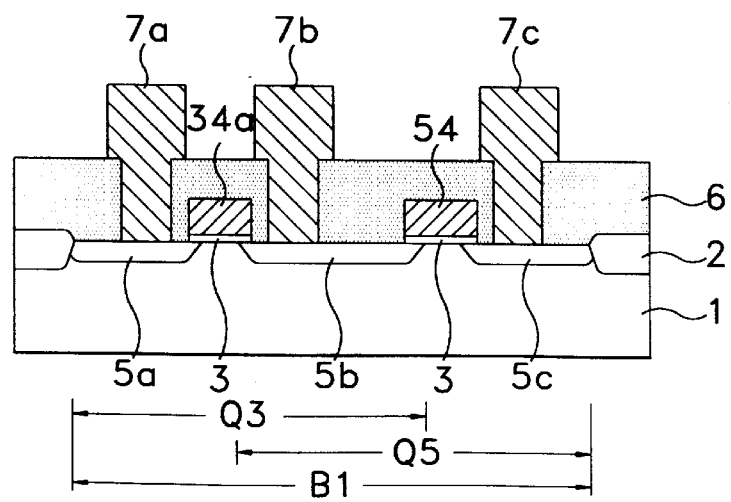
FIG. 3 is a cross-sectional view of a pull-down transistor and an access transistor of the conventional SRAM cell.
Figure 4:
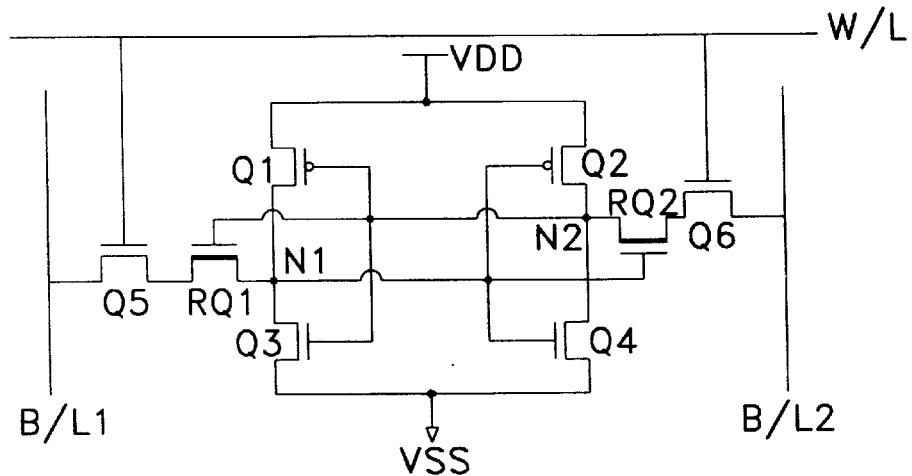
FIG. 4 is a circuit diagram of a SRAM cell with a full CMOS cell structure according to a preferred embodiment of the present invention.
Figure 5:
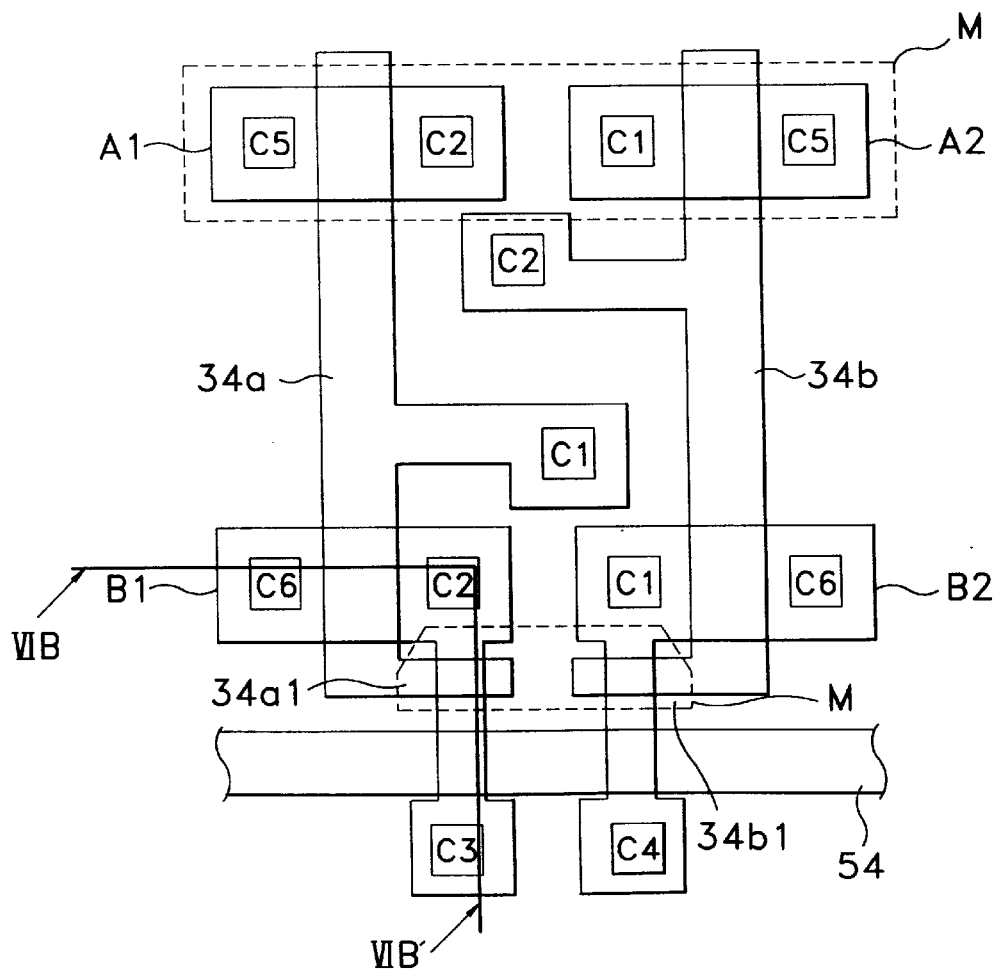
FIG. 5 is a plan view of the SRAM cell with the full CMOS cell structure according to a preferred embodiment of the present invention.

Meanwhile, in FIG. 4 to FIG. 6, a feature appearing in both FIG. 1 and in FIGS 4 to 6 has the same reference numeral throughout, and further descriptions of such features are omitted.

FIG. 4 is a circuit diagram of an SRAM cell with a full CMOS structure according to a preferred embodiment of the present invention.

As illustrated in FIG. 4, the SRAM cell according to the invention has devices for imparting a resistance, preferably N channel depletion transistors RQ1 and RQ2 between the cell nodes N1 and N2 and NMOS transistors Q5 and Q6 for use in access device. Gates of the depletion transistors RQ1 and RQ2 are connected with the cell nodes N2 and N1. Sources of the depletion transistors RQ1 and RQ2 are connected with the drains of NMOS transistors Q5 and Q6 for use in access devices, and drains of the depletion transistors RQ1 and RQ2 are connected with the cell nodes N1 and N2. The depletion transistors RQ1 and RQ2 effectively work on the NMOS transistors Q5 and Q6 for use in access devices as resistors, so that the current amount of the NMOS transistors Q5 and Q6 for use in access devices is reduced.

FIG. 5 is a plan view of the SRAM cell illustrated in FIG. 4. In FIG. 5, 34$a$1 and 34$b$1 are gate lines of the depletion transistors RQ1 and RQ2. As illustrated in FIG. 5, gate lines 34$a$ and 34$b$ of the PMOS transistors Q1 and Q2 for use in pull-up devices and the NMOS transistors Q3 and Q4 for use in pull-down devices are projected between the cell node contact regions C1 and the gate line 54 of the NMOS transistors Q5 and Q6 for use in access devices, so that the gate lines 34$a$1 and 34$b$1 of the depletion transistors RQ1 and RQ2 are formed. As shown in FIG. 5, the depletion transistors RQ1 and RQ2 are inserted without increasing the size of the SRAM cell. There is also provided mask pattern M used for implanting ions to control the P channel threshold voltage (Vt) of the PMOS transistors Q1 and Q2 for use in pull-up devices. Here, the mask pattern M is an open pattern to expose the active regions A1 and A2 of the PMOS transistors Q1 and Q2 and the channel regions of the depletion transistors RQ1 and RQ2 in the active regions B1 and B2. The N channel regions of the depletion transistors RQ1 and RQ2 are formed at the same time that ion implanting of N type impurity ions to control a threshold voltage of the PMOS transistors Q1 and Q2 occurs.

Meanwhile, FIG. 5 illustrates only the full CMOS SRAM cell structure, the above structure can be applied also to the HRL SRAM cell and P-channel polysilicon TFT SRAM cell.

Figure 6A:
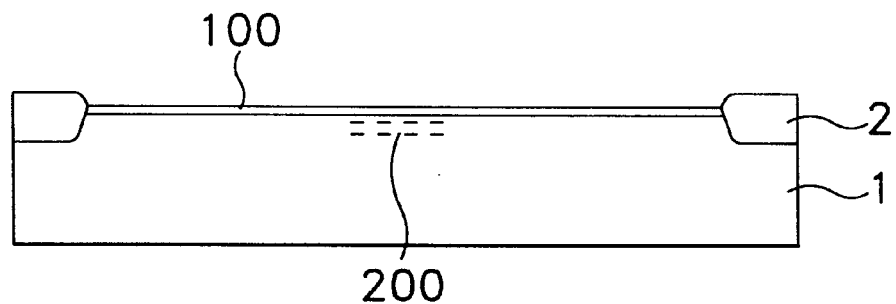
FIG. 6A is cross-sectional view of a field oxide layer formed on a semiconductor substrate illustrating an intermediate stage of a portion of the device depicted in FIG. 5 during a method of manufacturing the device depicted in FIG. 5.
Figure 6B:
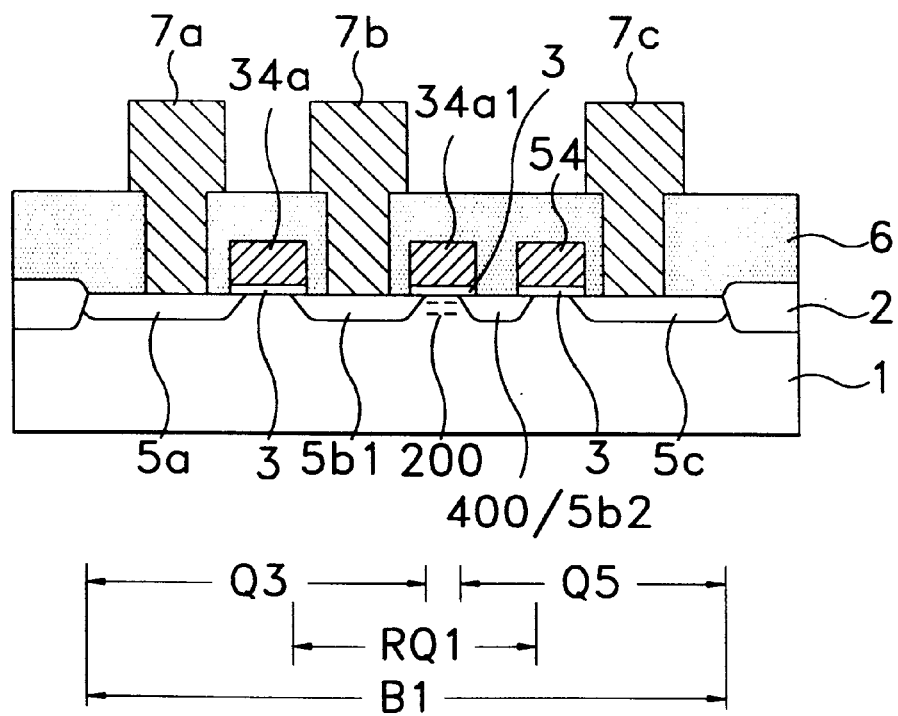
FIG. 6B is a sectional view of a portion of the device depicted in FIG. 5 taken along the line VIB1-VIB1'.

Referring to FIGS. 6A and 6B, a method of manufacturing and an embodiment of the SRAM cell having the depletion transistors will be described. Here, FIGS. 6A and 6B are sectional views of the active region B1 taken along the line VIB1-VIB1' of FIG.5, and illustrate a method of forming the depletion transistor RQ1 between the NMOS transistor Q3 for use in pull-down devices and the NMOS transistor Q5 for use in access devices.

As illustrated in FIG. 6A, a field oxide layer 2 is formed on a P type semiconductor substrate 1 by a known LOCOS (LOCal Oxidation of Silicon) technique, so that the active region B1 is defined. A screen oxide layer 100 is formed on the substrate 1 between the field oxide layer 2. N type impurity ions, preferably, P or As ion, are then ion implanted into a predetermined channel area of the depletion transistor RQ1 in the active region B1 to a concentration of about $5 \times 10^{10}$ to $5 \times 10^{12}$ ions/cm$^2$, so that the N channel region 200 of the depletion transistor RQ1 is formed. The N channel region 200 of the depletion transistor RQ1 is formed by the ion implanting using the mask pattern M illustrated in FIG. 5. At the same time that ion-implantation is done to form the N channel region 200, ion implantation to control the P channel Vt of the PMOS transistors Q1 and Q2 for use in pull-up devices is done. Therefore, another process step is not added to form the depletion transistors RQ1 and RQ2.

As illustrated in FIG. 6B, the screen oxide layer 100 is removed and the gate insulating layer 3 is formed on the substrate 1. A polysilicon layer is formed on the gate insulating layer 3. The polysilicon layer and the gate insulating layer 3 are etched, so that gates 34a, 34a1 and 54 of the NMOS transistor Q3 for use in pull-down devices, the depletion transistor RQ1 and NMOS transistor Q5 for use in access devices are formed. Source and drain regions 5a, 5b1, 400/5b2, 5c are then formed in the active region B1. At this time, the gate 34a1 of the depletion transistor RQ1 is formed on the N-channel region 200 and between the gate 34a of the NMOS transistor Q3 for use in pull-down devices and the gate 54 of the NMOS transistor Q5 for use in access devices. The drain region 5b1 is a common drain region of the NMOS transistor Q3 for use in pull-down devices and the depletion transistor RQ1. The source region 400 of the depletion transistor RQ1 is connected to the drain region 5b2 of the NMOS transistor Q5 for use in access devices.

Thereafter, an intermediate insulating layer 6 is formed on the overall surface of the substrate 1, and etched to expose the source and drain regions 5a and 5b1 of the NMOS transistor Q3 for use in pull-down devices and the source region 5c of the NMOS transistor Q5 for use in access devices, thereby forming contact holes. A metal layer is then deposited on the intermediate insulating layer 6 to fill the contact holes. The metal layer is then patterned thereby forming metal interconnection layers 7a, 7b and 7c.

According to the present invention, each depletion transistor is inserted between a cell node and an access device, so that the current amount of the access devices is reduced The depletion transistors therefore effectively work as resistors. Therefore, the cell ratio is increased thereby enhancing operational characteristics of the SRAM cell. In addition, the present invention embodies a streamlined method for manufacturing a SRAM cell having a current reducing means for reducing the current amount of the access device. Furthermore, the depletion transistor is formed an already available area thereby not increasing the size of the SRAM cell.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as falling within the true scope of the invention.

What is claimed is:

1. An SRAM cell having pull-up devices, pull-down devices and access devices that interconnect at cell nodes, comprising:

current reduction means for reducing current of said access devices, wherein said current reduction means are connected between said access devices and said cell nodes, and wherein said current reduction means imparts a resistance. and wherein said current reduction means is an N channel depletion transistor, and wherein the SRAM cell further comprises:

a semiconductor substrate of a first conductivity type of which an active region is defined a gate insulating layer formed on said substrate;

first and second gates formed on said gate insulating layer and a third gate formed between said first and second gates:

a channel region of a second conductivity type formed in the active region under said third gate;

impurity diffusion regions of said second conductivity type formed in said active region on both sides of said first, second and third gates;

an intermediate insulating layer formed on said substrate, and having contact holes to expose said impurity diffusion regions located at either side of said first gate and a side of said second gate that is not adjacent to said third gate: and metal-interconnection layers in contact with said exposed impurity diffusion regions through the contact holes.

2. The SRAM cell according to claim 1, wherein the pull-up devices are P channel bulk MOSFETs.

3. The SRAM cell according to claim 1, wherein the pull-up devices impart resistance.

4. The SRAM cell according to claim 1, wherein the pull-up devices are P channel polysilicon TFTs.

5. An SRAM cell comprising pull-up devices, said pull-up devices including a first P channel transistor (Q1) and a second P channel transistor (Q2), pull-down devices, said pull-down devices including a first N channel transistor (Q3) and a second N channel transistor (Q4) and access devices, said access devices including a third N channel transistor (Q5) and a fourth N channel transistor (Q6), wherein each of said transistors (Q1, Q2, Q3, Q4, Q5, Q6) is formed in a semiconductor substrate, and wherein the SRAM cell further comprises depletion transistors comprising a fifth N channel transistor (RQ1) and a sixth N channel transistor (RQ2), said fifth N channel transistor (RQ1) formed between said third N channel transistor (Q5) and said first N channel transistor (Q3) and said sixth N channel transistor (RQ2) formed between said fourth N channel transistor (Q6) and said second N channel transistor (Q2), for reducing current of said access devices, wherein each of said transistors comprises a gate, a first impurity region and a second impurity region formed in the semiconductor substrate, wherein the first impurity region of said fifth N channel transistor (RQ1) is shared with one of the impurity regions of said third N channel transistor (Q5), and the second impurity region of said fifth N channel transistor (RQ1) is shared with one of the impurity regions of said first N channel transistor (Q3), and wherein the first impurity region of said sixth N channel transistor (RQ2) is shared with one of the impurity regions of said fourth N channel transistor (Q6), and the second impurity region of said sixth N channel transistor (RQ2) is shared with one of the impurity regions of said second N channel transistor (Q4), and wherein said gates of said depletion transistors are connected together and wherein each gate of said depletion transistors is connected to the gate of one of said pull-up devices and to the gate of one of said pull-down devices.

6. The SRAM cell of claim 5, wherein said fifth N channel transistor (RQ1) and said sixth N channel transistor (RQ2) are bulk MOSFETs.

7. The SRAM cell of claim 5, wherein said fifth N channel transistor (RQ1) and said sixth N channel transistor (RQ2) are polysilicon TFTs.

* * * * *

UNITED STATES PATENT AND TRADEMARK OFFICE
CERTIFICATE OF CORRECTION

PATENT NO : 5,966,321
DATED : October 12, 1999
INVENTOR(S): J. Kim

It is certified that error appears in the above-identified patent and that said Letters Patent is hereby corrected as shown below:

At col. 3, line 24, please cancel "imports" and substitute --imparts-- therefor.

At col. 5, line 63, please insert a --.-- after "reduced".

At col. 6, line 29 (claim 1, line 13), please insert a --;-- after "defined";

at line 33 (claim 1, line 17), please cancel ":" and substitute --;-- therefor; and at line 44 (claim 1, line 27), please cancel ":" and substitute --;-- therefor.

Signed and Sealed this

Thirtieth Day of May, 2000

Attest:

Q. TODD DICKINSON

*Attesting Officer*    *Director of Patents and Trademarks*